United States Patent
Ho et al.

(10) Patent No.: US 9,041,129 B2
(45) Date of Patent: May 26, 2015

(54) SEMICONDUCTOR MEMORY STORAGE ARRAY DEVICE AND METHOD FOR FABRICATING THE SAME

(71) Applicant: National Applied Research Laboratories, Taipei (TW)

(72) Inventors: Chia-Hua Ho, Hsinchu (TW); Ming-Daou Lee, Chiayi (TW); Wen-Cheng Chiu, Hsinchu (TW); Cho-Lun Hsu, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 0 days.

(21) Appl. No.: 14/087,355

(22) Filed: Nov. 22, 2013

(65) Prior Publication Data
US 2014/0077150 A1    Mar. 20, 2014

Related U.S. Application Data

(63) Continuation-in-part of application No. 13/452,544, filed on Apr. 20, 2012, now Pat. No. 8,835,894.

(30) Foreign Application Priority Data
Feb. 24, 2012   (TW) ............................... 101106428 A

(51) Int. Cl.
*H01L 29/82*   (2006.01)
*H01L 27/24*   (2006.01)
*H01L 27/22*   (2006.01)
(Continued)

(52) U.S. Cl.
CPC .......... *H01L 27/2463* (2013.01); *H01L 27/222* (2013.01); *H01L 27/1052* (2013.01); *H01L 45/04* (2013.01); *H01L 45/1233* (2013.01);
(Continued)

(58) Field of Classification Search
USPC ............ 257/4, 43, 421, 5; 438/129, 237, 295, 438/652, 3
See application file for complete search history.

(56) References Cited

U.S. PATENT DOCUMENTS

| | | | |
|---|---|---|---|
| 2005/0254219 A1 | 11/2005 | Nakanishi et al. | |
| 2005/0254291 A1* | 11/2005 | Happ et al. ................... | 365/163 |
| 2012/0097915 A1 | 4/2012 | Mikawa et al. | |

FOREIGN PATENT DOCUMENTS

| | | |
|---|---|---|
| TW | I284899 | 12/2005 |
| TW | I322993 | 4/2010 |

(Continued)

OTHER PUBLICATIONS

Wouters, et al., "Analysis of Complementary RRAM Switching", Aug. 2012, pp. 1186-1188, vol. 33, No. 8, IEEE Electron Device Letters.
(Continued)

*Primary Examiner* — Errol Fernandes
(74) *Attorney, Agent, or Firm* — WPAT, PC; Justin King

(57) ABSTRACT

A semiconductor memory storage array device comprises a first electrode layer, an oxide layer, a second electrode layer, a memory material layer and a first insulator layer. The oxide layer is disposed on the first electrode layer. The second electrode layer is disposed on the oxide layer. The memory material layer is disposed on the second electrode layer. The first insulator layer is disposed adjacent to two sidewalls of the first electrode layer, the oxide layer, the second electrode layer and the memory material layer, so to define a gap either between the first electrode layer and the oxide layer or between the second electrode layer and the oxide layer.

7 Claims, 22 Drawing Sheets

(51) Int. Cl.
    *H01L 27/105*    (2006.01)
    *H01L 45/00*    (2006.01)

(52) U.S. Cl.
    CPC ........ *H01L 45/1675* (2013.01); *H01L 27/2481* (2013.01)

(56) References Cited

FOREIGN PATENT DOCUMENTS

| | | |
|---|---|---|
| TW | I323928 | 4/2010 |
| TW | I332249 | 10/2010 |
| TW | I335073 | 12/2010 |

OTHER PUBLICATIONS

Ho, et al., "Threshold Vacuum Switch (TVS) on 3D-Stackable and 4F2 Cross-Point Bipolar and Unipolar Resistive Random Access Memory", Dec. 10, 2012, National Nano Device Laboratories (NDL), Hsinchu Science Park, Taiwan.

Burr, et al., "Large-scale (512kbit) integration of Multilayer-ready Access-Devices based on Mixed-Ionic-Electronic-Conduction (MIEC) at 100% yield", 2012 Symposium on VLSI Technology Digest of Technical Papers.

Kau, et al., "A stackable cross point phase change memory", 2009, IEEE.

Hosoi, et al., "High Speed Unipolar Switching Resistance RAM (RRAM) Technology", 2006, i Technical Disgest—International Electron Devices Meeting, IEDM.

* cited by examiner

SEMICONDUCTOR MEMORY STORAGE ARRAY DEVICE AND METHOD FOR FABRICATING THE SAME

This application is a continuation-in-part (CIP) of U.S. application Ser. No. 13/452,544 filed on Apr. 20, 2012. The entire disclosure of U.S. application Ser. No. 13/452,544 is incorporated herein by reference.

BACKGROUND OF THE INVENTION

1. Field of the Invention

The present invention relates to a memory structure and a method for fabricating the same, particularly to an ultra high density non-volatile memory device having a quadruple memory density in an identical area.

2. Description of the Related Art

Advanced memories are emerging persistently, such as PCRAM (Phase Change Random Access Memory), MRAM (Magnetic Random Access Memory) and RRAM (Resistive Random Access Memory). Featuring high read/write speed, non-destructive reading, durability to extreme temperature, high integration with related circuits, RRAM is regarded as a memory potential to replace all the existing ones.

RRAM also has advantages of high density, low cost, low power consumption, superior data retention ability, and simple structure. Refer to FIG. 1 schematically showing an array structure of a conventional RRAM. The conventional RRAM comprises a plurality of first metal lines 10 functioning as bit lines and a plurality of second metal lines 12 functioning as word lines. The first metal lines 10 intersect the second metal lines 12. An insulating layer 14 is arranged between the first metal lines 10 and the second metal lines 12. Thus is formed a memory cell 16 in each intersection of the first metal lines 10 and the second metal lines 12.

The quantity of the memory cells 16 depends on the quantities of the first metal lines 10 and second metal lines 12. For example, there are 21 memory cells 16 if there are 7 first metal lines 10 in columns and 3 second metal lines 12 in rows. The principle of RRAM is that a voltage is applied to the first and second metal lines 10 and 12 to transform the insulating layer 14 from a high-resistance state to a low-resistance state or from a low-resistance state to a high-resistance state.

Because of market demand and technical evolution, the size of elements has reduced from microns to nanometers (1-100 nm). Suppose that the minimum feature size is 90 nm and denoted with F. In a conventional RRAM, the first metal line 10 has a width of 1 F, and the spacing between two adjacent first metal lines 10 is also 1 F. Thus, one first metal line 10 and the spacing thereof have a total width of 2 F. The second metal line 12 has a width of 1 F, and the spacing between two adjacent second metal lines 12 is also 1 F. Thus, one second metal line 12 and the spacing thereof also have a total width of 2 F. Therefore, the conventional RRAM has a minimum cell area of 4 $F^2$. The scalability of such a memory structure has reached a physical limit. The density of a memory is unlikely to increase except the structures thereof are stacked up vertically. Nevertheless, the stacked memory structure is still hard to meet the demand for a high-capacity small-volume memory. Therefore, how to increase the memory density in a minimum memory area is a problem the manufacturers are eager to overcome.

SUMMARY OF THE INVENTION

The primary objective of the present invention is to provide an ultra high density resistive memory structure and a method for fabricating the same, wherein a photolithography-etching process is used to divide an electrode into two sub-electrodes to double the quantities of bit lines and word lines, whereby is quadrupled the density of memory cells, and whereby the present invention can use the 90 nm process to fabricate the memory structure having the same capacity as the memory structure fabricated in the 45 nm process, and whereby the density of a memory leaps ahead by two generations.

Another objective of the present invention is to provide an ultra high density resistive memory structure and a method for fabricating the same, wherein the structures of a memory is stacked up vertically to increase the capacity of the memory.

To realize the abovementioned objectives, the present invention proposes an ultra high density resistive memory structure, which comprises a plurality of memory cells. Each memory cell further comprises an upper electrode, a lower electrode, and a resistive layer. The upper electrode includes two separate upper sub-electrodes. The lower electrode includes two separate lower sub-electrodes. The two upper sub-electrodes intersect the two lower sub-electrodes. The resistive layer is arranged between the upper sub-electrodes and the lower sub-electrodes. Thereby, four sub-memory cells are formed in the intersections of the two upper sub-electrodes and the two lower sub-electrodes.

The present invention also proposes a method for fabricating an ultra high density resistive memory structure, which comprises steps: providing a substrate; forming a dielectric layer on the substrate; forming two separate first lower dielectric layers on the dielectric layer with a photolithography-etching process; forming two separate lower sub-electrodes over the dielectric layer and respectively on sidewalls of the two first lower dielectric layers; forming a second lower dielectric layer over the dielectric layer and inside a gap between the two lower sub-electrodes; removing a portion of the two lower sub-electrodes and a portion of the two first lower dielectric layers to form two first openings respectively at two opposite sides of the second lower dielectric layer to make the two lower sub-electrodes independently controlled; forming two third lower dielectric layers respectively inside the two first openings and flattening the two third lower dielectric layers; forming a resistive layer over the two first lower dielectric layers, the two lower sub-electrodes, the second lower dielectric layer, and the two third lower dielectric layers; forming on the resistive layer two separate first upper dielectric layers intersecting the two first lower dielectric layers to present a cross-like shape; forming two separate upper sub-electrodes over the resistive layer and respectively on sidewalls of the two first upper dielectric layers; forming a second upper dielectric layer over the resistive layer and inside a gap between the two upper sub-electrodes; removing a portion of the two upper sub-electrodes and a portion of the two first upper dielectric layers to form two second openings respectively at two opposite sides of the second upper dielectric layer to make the two upper sub-electrodes independently controlled; and forming two third upper dielectric layers respectively inside the two second openings to facilitate the process of stacking memory cells. The present invention quadruples the capacity of a memory structure in the same area, using the 90 nm process to fabricate the upper electrode into two upper sub-electrodes and the lower electrode into two lower sub-electrodes.

In accordance with one aspect, the present invention provides a semiconductor memory storage array device formed on a substrate and the method for fabricating the same, wherein the semiconductor memory storage array device comprises a first electrode layer, an oxide layer, a second electrode layer, a memory material layer and a first insulator layer. The oxide layer is disposed on the first electrode layer. The second electrode layer is disposed on the oxide layer. The memory material layer is disposed on the second electrode layer. The first insulator layer is disposed adjacent to two sidewalls of the first electrode layer, the oxide layer, the second electrode layer and the memory material layer, so to define a gap either between the first electrode layer and the oxide layer or between the second electrode layer and the oxide layer.

Below, embodiments are described in detail to make easily understood the objectives, technical contents, characteristics and accomplishments of the present invention.

DETAILED DESCRIPTION OF THE INVENTION

With emerging portable electronics and persistent function upgrade, the global memory market is also growing fast. Under a situation that the feature size of semiconductor is unlikely to reduce anymore, the Inventors have been devoted to research and development and finally propose an ultra high density resistive memory structure to further increase the capacity of a memory in an identical area, whereby to satisfy the demand for higher capacity memories and meet the trend toward compact and slim products.

Figure 1:
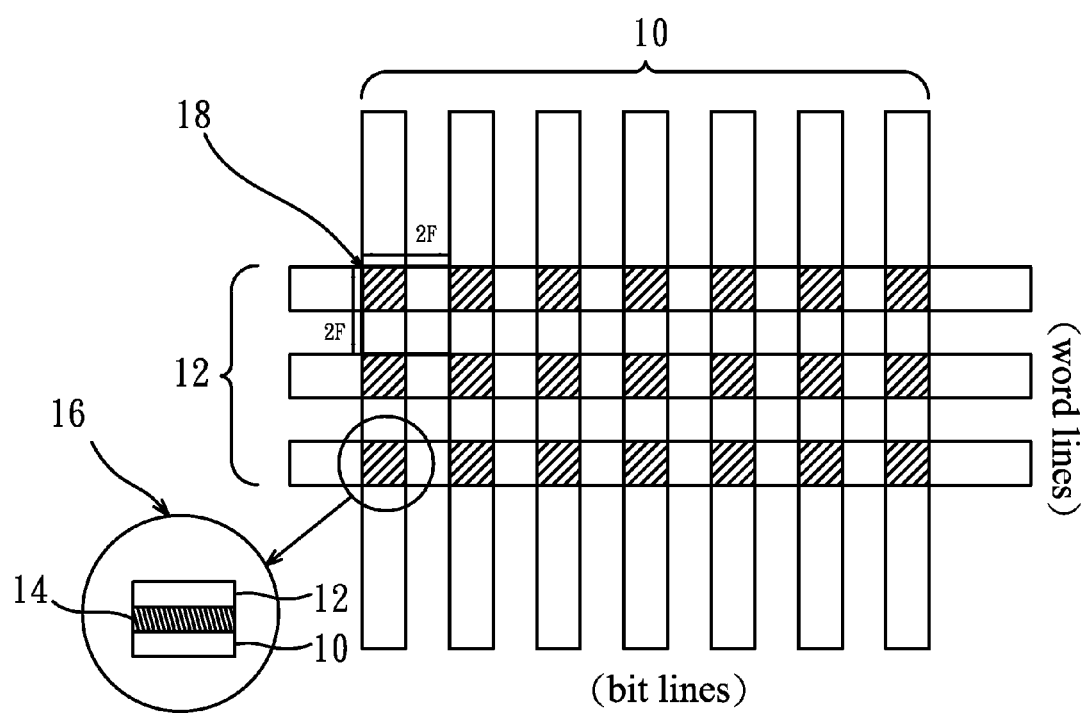
FIG. 1 schematically shows an array structure of a conventional RRAM.
Figure 2:
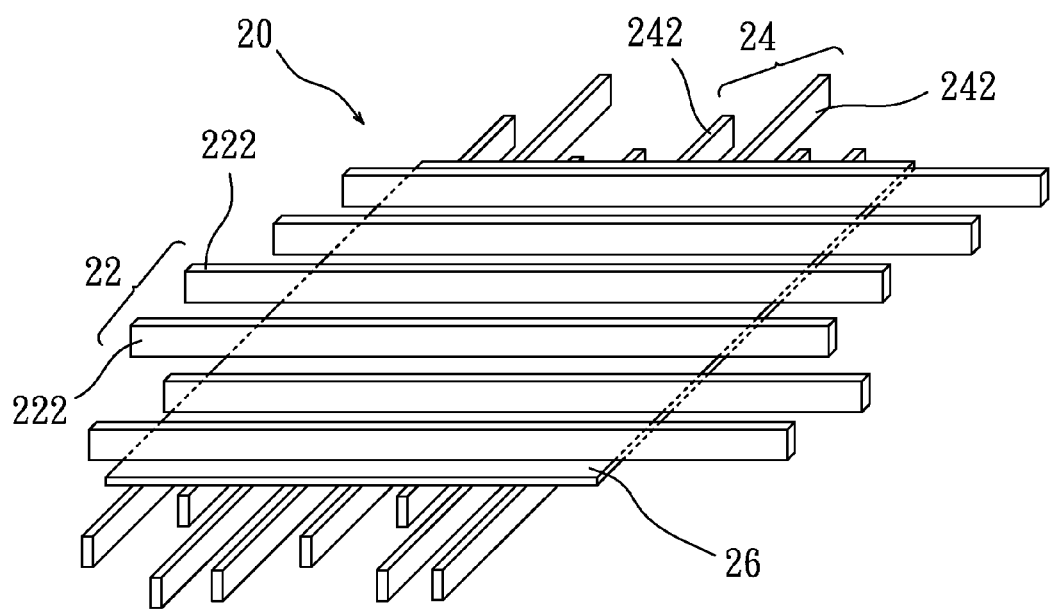
FIG. 2 is a perspective view schematically showing an ultra high density resistive memory structure according to one embodiment of the present invention.
Figure 3:
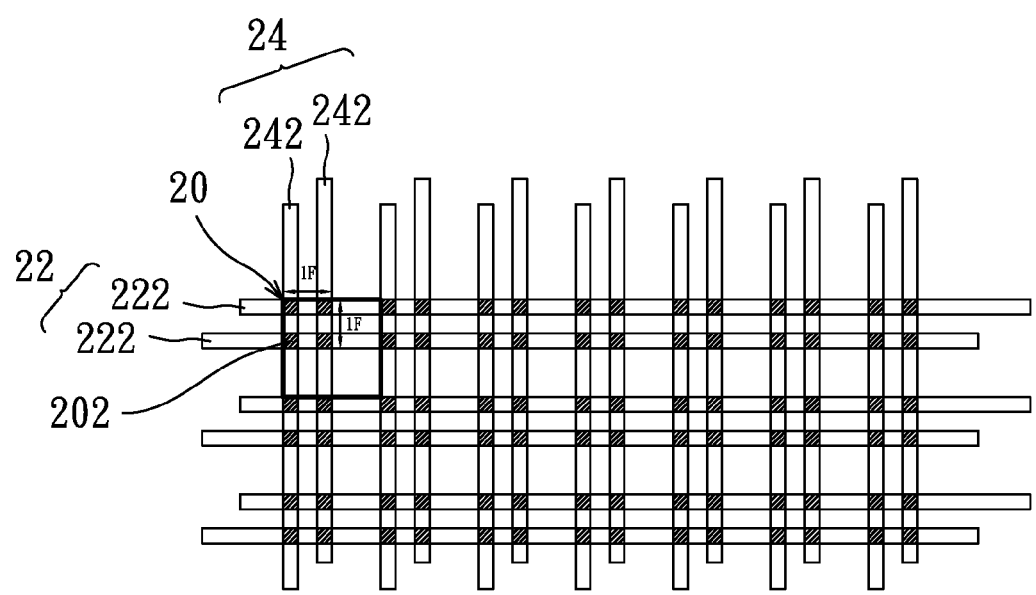
FIG. 3 is a top view schematically showing an ultra high density resistive memory structure according to one embodiment of the present invention.

Refer to FIG. 2 and FIG. 3 respectively a perspective view and a top view of an ultra high density resistive memory structure according to one embodiment of the present invention. The ultra high density resistive memory structure of the present invention comprises a plurality of memory cells 20. Each memory cell 20 further comprises an upper electrode 22, a lower electrode 24 and a resistive layer 26. In this embodiment, the memory having a feature size of 90 nm is improved to increase the density thereof. The lower electrode 24 has two separate lower sub-electrodes 242. In other words, the original lower electrode 24 having a width of 1 F is fabricated into two separate lower sub-electrodes 242, and the two lower sub-electrodes 242 and the gap therebetween totally have a width of 1 F. The resistive layer 26 is arranged over the lower electrode 24. The upper electrode 22 is laid over the resistive layer 26 and arranged to intersect the lower electrode 24. The upper electrode 22 has two separate upper sub-electrodes 222. In other words, the original upper electrode 22 having a width of 1 F is fabricated into two separate upper sub-electrodes 222, and the two upper sub-electrodes 222 and the gap therebetween totally have a width of 1 F. The resistive layer 26 is interposed between the upper electrode 22 and the lower electrode 24. Thus, the intersections of the two upper sub-electrodes 222 and the two lower sub-electrodes 242 form four sub-memory cells 202. Therefore, the present invention can fabricate memory cells having an area of 1 $F^2$, which is much smaller than 4 $F^2$ the area of the memory cells of the conventional RRAM. Refer to FIG. 1 again. The conventional RRAM has 7 first metal lines 10 (the lower electrodes) and 3 second metal lines 12 (the upper electrodes). Thus, the conventional RRAM has 21 memory cells. In the same area of the memory structure of the present invention, the quantity of the lower sub-electrodes 242 is 14, which is the double of the quantity of the first metal lines 10; the quantity of the upper sub-electrodes 222 is 6, which is also the double of the quantity of the second metal lines 12. Thus, the memory structure of the present invention has 84 memory cells 202, which are quadruple the memory cells of the conventional RRAM in the same area. Therefore, the present invention can use the 90 nm process to fabricate the memory structure having the same capacity as the memory structure fabricated in the 45 nm process.

Figure 4A:
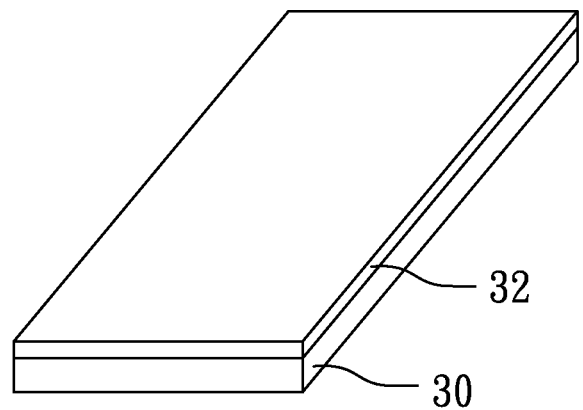
FIGS. 4A-4R schematically show the steps of a method for fabricating an ultra high density resistive memory structure according to one embodiment of the present invention.
Figure 4B:
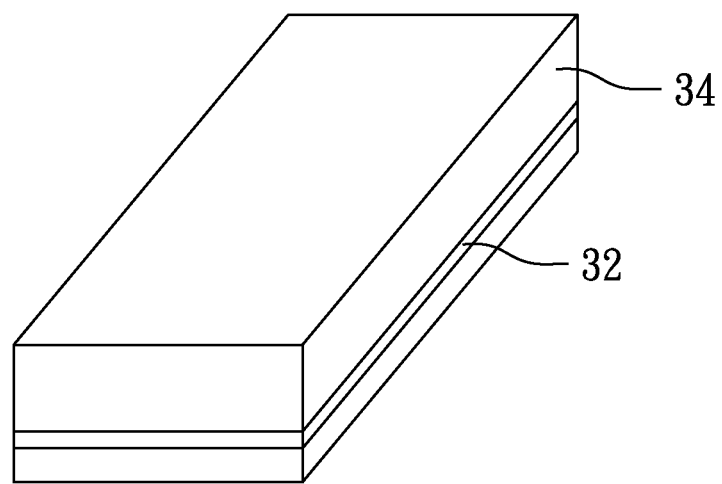
Figure 4C:
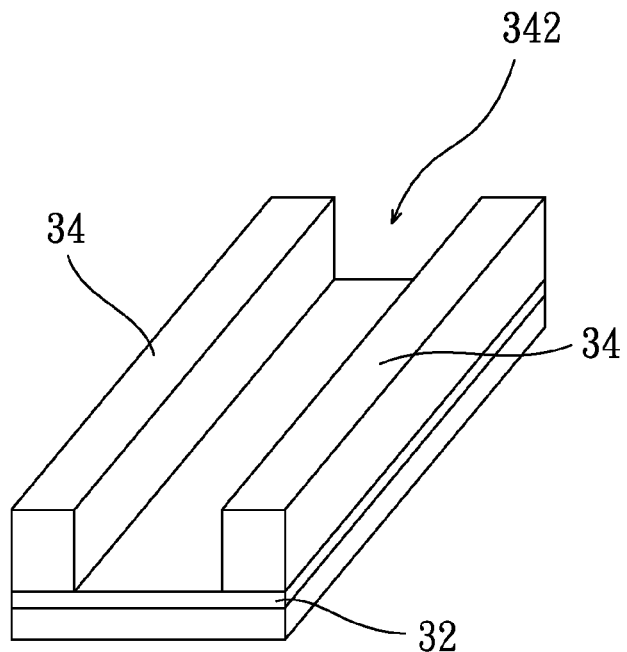
Figure 4D:
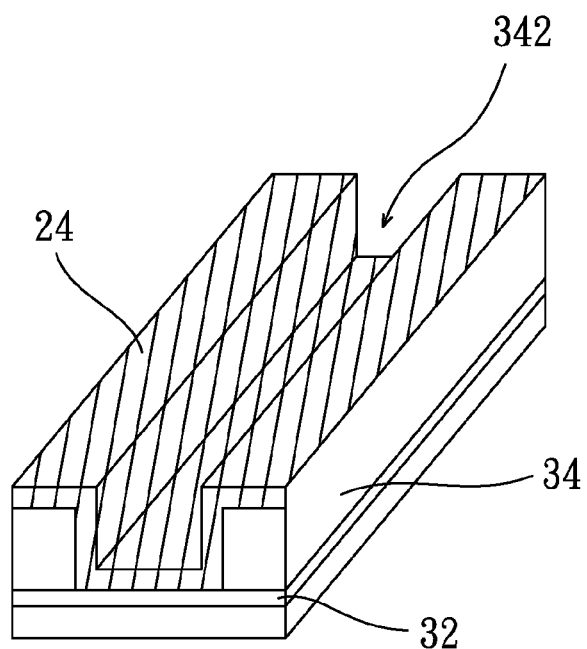
Figure 4E:
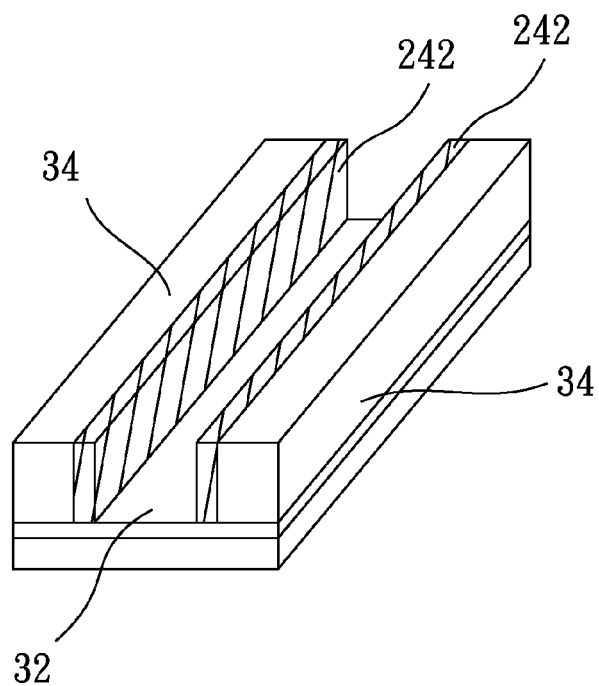
Figure 4F:
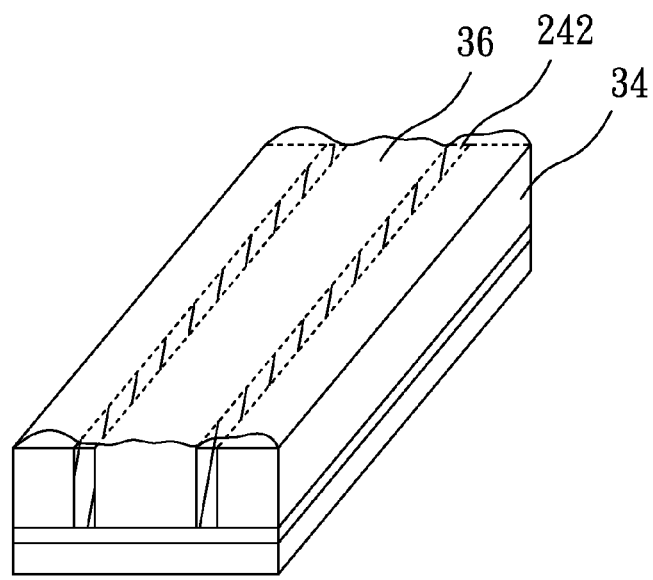
Figure 4G:
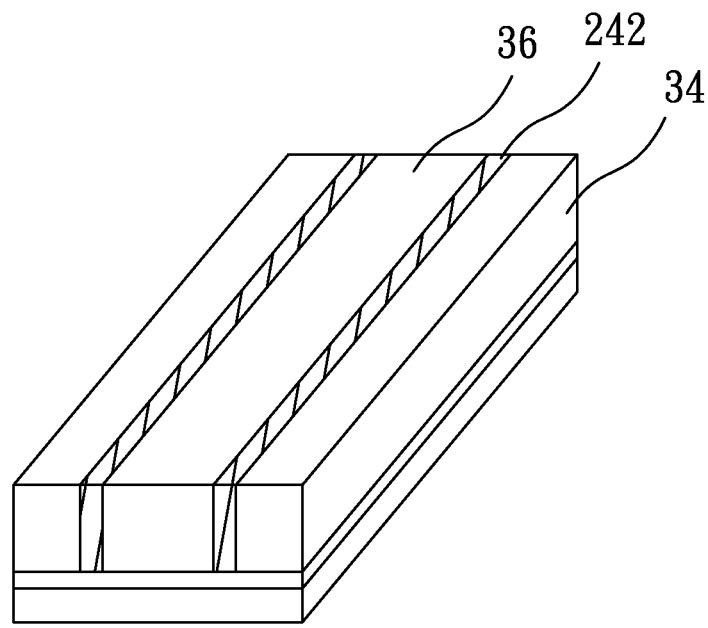
Figure 4H:
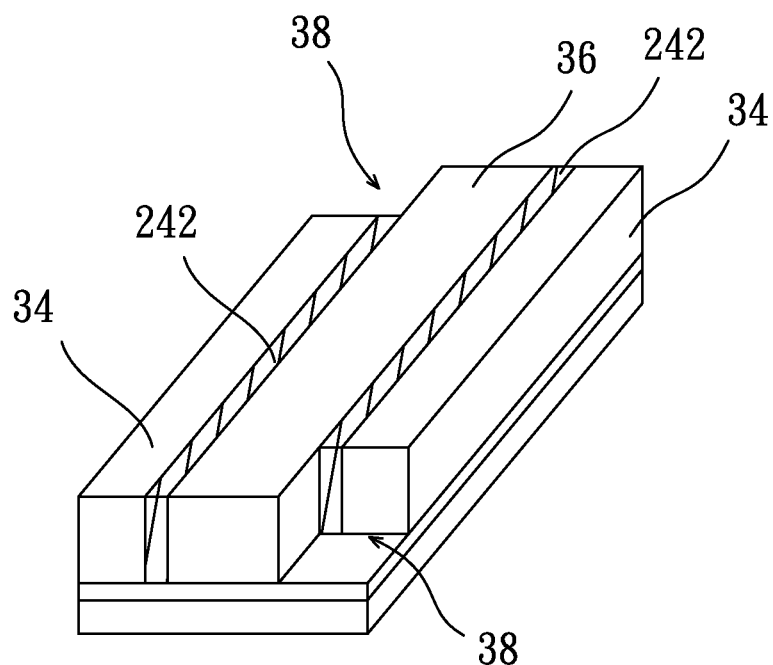
Figure 4R:
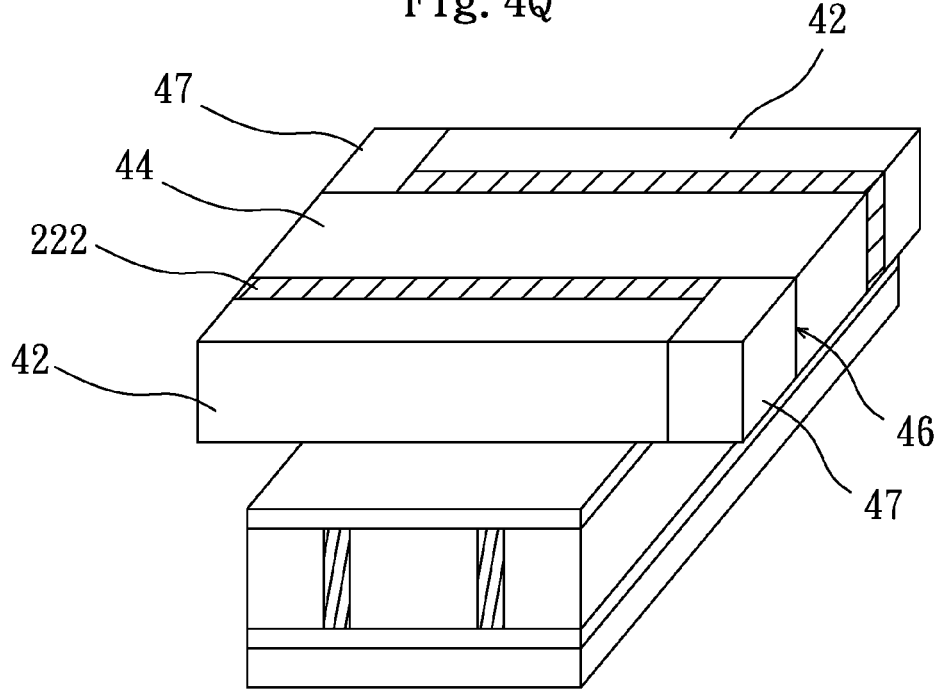
Figure 5A:
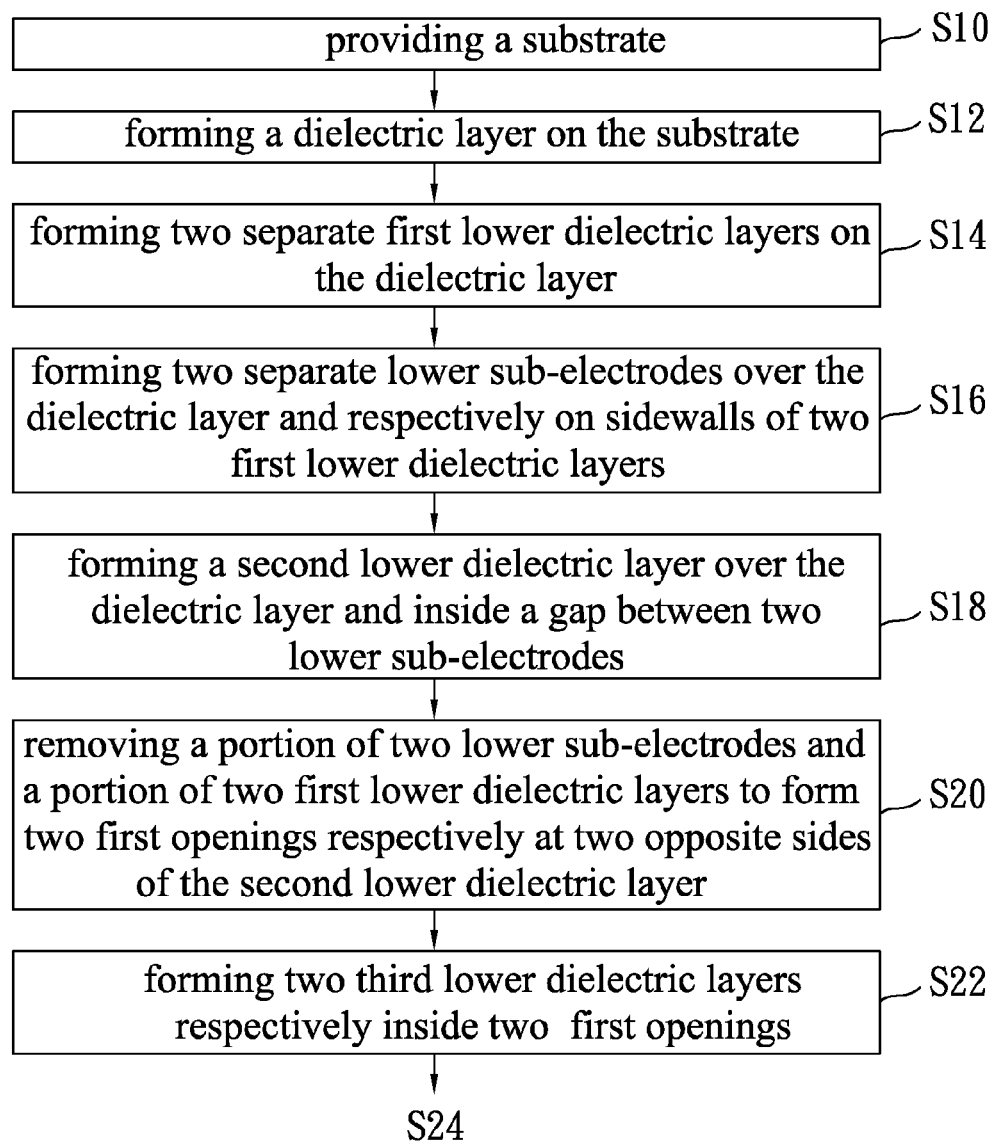
FIG. 5A-5B shows a flowchart of a method for fabricating an ultra high density resistive memory structure according to one embodiment of the present invention.
Figure 5B:
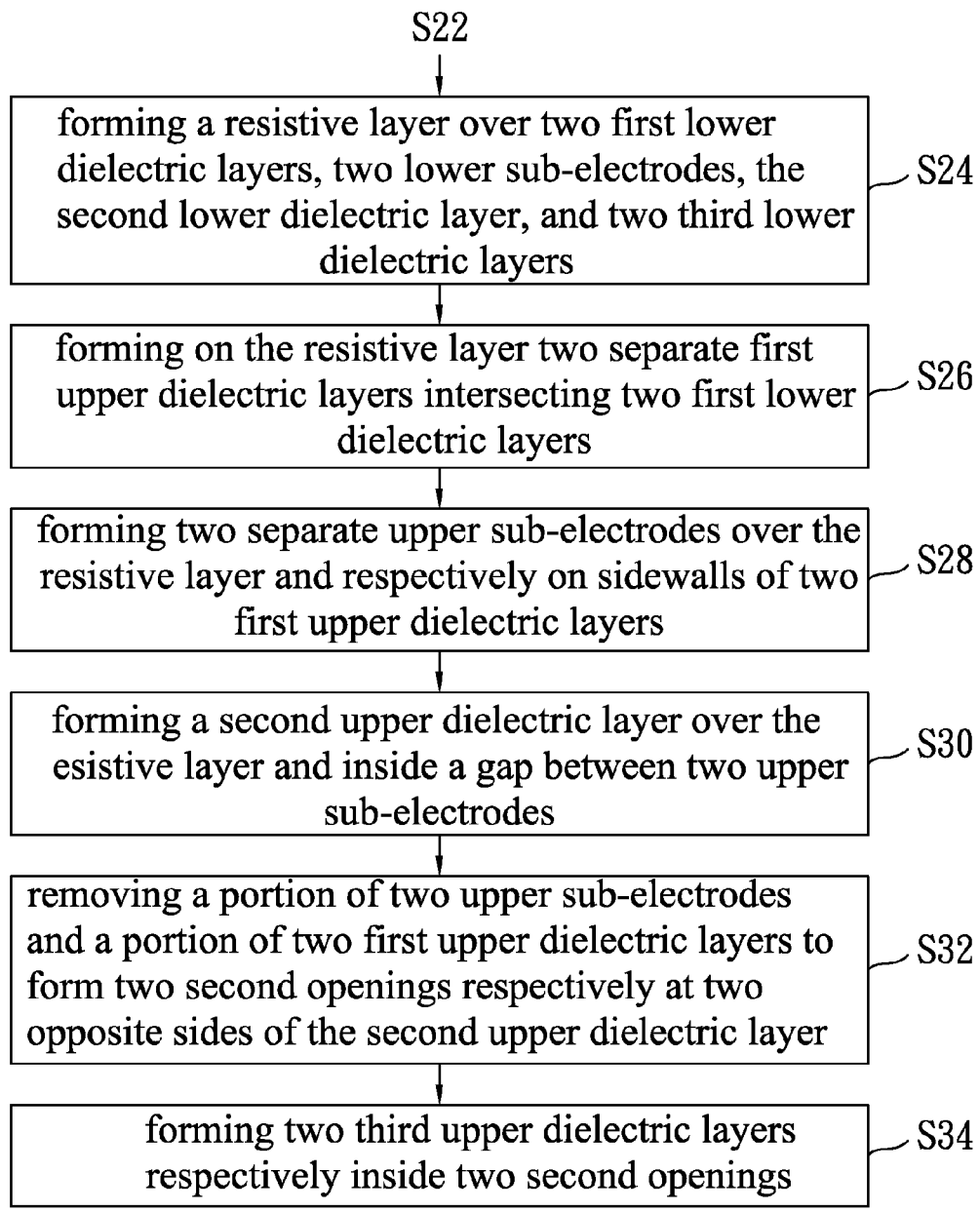

Below is introduced a method for fabricating an ultra high density resistive memory structure of the present invention. Refer to FIGS. 4A-4R and FIG. 5A-5B. FIGS. 4A-4R schematically show the steps of a method for fabricating an ultra high density resistive memory structure according to one embodiment of the present invention. FIG. 5A-5B shows a flowchart of a method for fabricating an ultra high density resistive memory structure according to one embodiment of the present invention. In Step S10, provide a substrate 30, such as a substrate made of silicon. In Step S12, form a dielectric layer 32 (such as a dielectric layer made of silicon dioxide ($SiO_2$)) on the substrate 30, as shown in FIG. 4A. In Step S14, form a complete layer of a first lower dielectric layer 34 (made of such as silicon nitride (SiN)) on the dielectric layer 32, as shown in FIG. 4B; next, use a photolithography-etching process to form a trench 342 in the middle of the first lower dielectric layer 34 to generate two separate first lower dielectric layers 34 on the dielectric layer 32, as shown in FIG. 4C. In Step S16, form a complete layer of a lower electrode 24 over the first lower dielectric layer 34 and the dielectric layer 32 inside the trench 342 with a CVD (Chemical Vapor Deposition) method, a PVD (Physical Vapor Deposition) method, or an ALD (Atomic Layer Deposition) method, as shown in FIG. 4D; next, use an RIE (Reactive Ion Etching) process and one of chlorine, argon and hydrogen bromide to remove the lower electrode 24 on the first lower dielectric layer 34 and a portion of the lower electrode 24 inside the trench 342 to form two separate lower sub-electrodes 242 above the dielectric layer 32 and respectively on two sidewalls of two separate first lower dielectric layers 34, as shown in FIG. 4E. The preferred width of the lower sub-electrode 24 is 1-10 nm.

In Step S18, use a CVD method to form a second lower dielectric layer 36 over the dielectric layer 32 inside the gap between the two separate lower sub-electrodes 242. The second lower dielectric layer 36 is made of silicon dioxide or silicon nitride. As shown in FIG. 4F, the as-deposited second lower dielectric layer 36 is rugged. Therefore, a CMP (Chemical Mechanical Polishing) method is used to flatten the as-deposited second lower dielectric layer 36 and make the top of the second lower dielectric layer 36 and the top of two lower sub-electrodes 242 on the same plane, as shown in FIG. 4G. In Step S20, use a photolithographic process (such as a photomask process) and an etching process (such as an RIE process) to remove a portion of two lower sub-electrodes 242 and a portion of two first lower dielectric layers 34 to form two first openings 38 respectively at two opposite sides of the second lower dielectric layer 36, as shown in FIG. 4H. Thereby, the two lower sub-electrodes 242 are disconnected electrically and can be controlled independently. The description of the abovementioned steps demonstrates that the present invention can fabricate two lower sub-electrodes 242 in a dimension of 1 F.

Figure 4I:
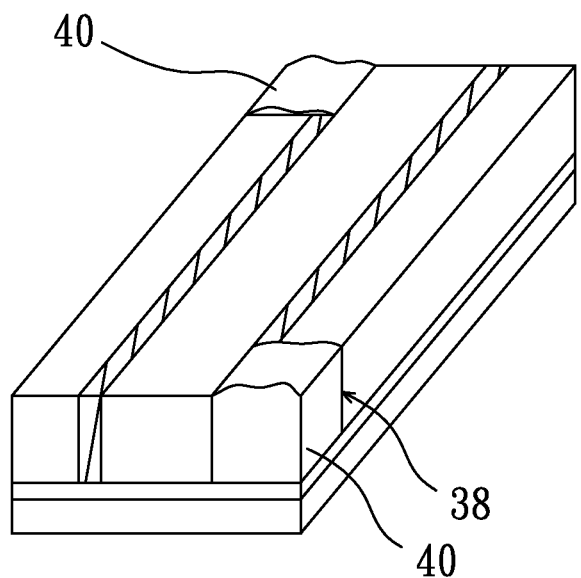
Figure 4J:
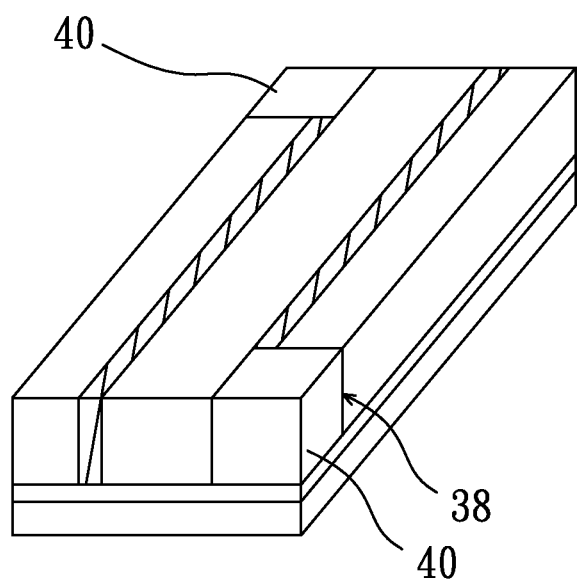
Figure 4K:
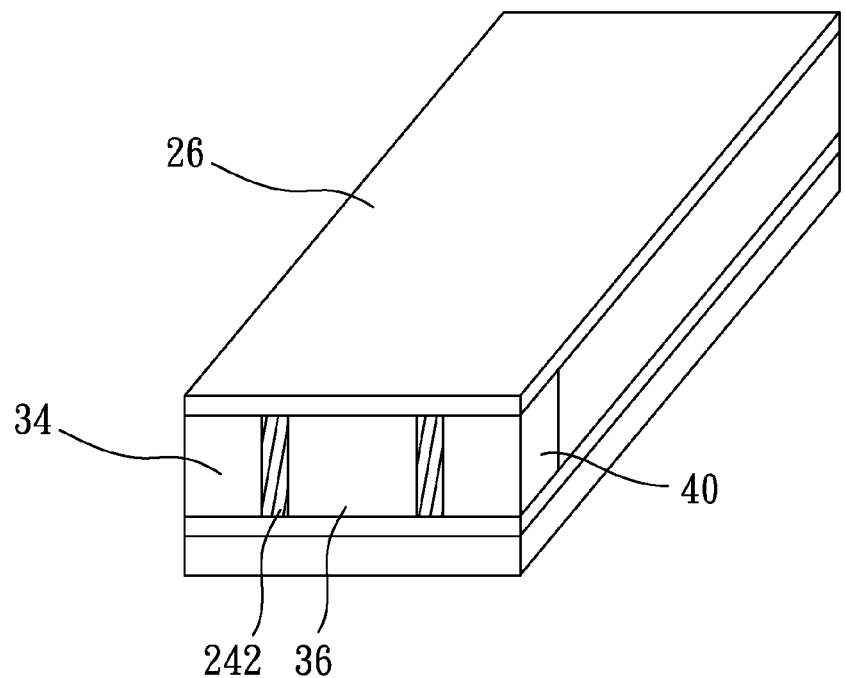

In Step S22, form two third lower dielectric layers 40 inside the two first openings 38, as shown in FIG. 4I. The third lower dielectric layers 40 are made of nitride or oxide. Similarly, the third lower dielectric layers 40 are flattened with a CMP method, as shown in FIG. 4J. In Step S24, form a resistive layer 26 over two first lower dielectric layers 34, two lower sub-electrodes 242, the second lower dielectric layer 36, and two third lower dielectric layers 40, as shown in FIG. 4K. The resistive layer 26 is made of a material selected from a group consisting of tungsten oxide ($WO_x$) hafnium oxide ($HfO_x$), titanium oxide ($TiO_x$), nickel oxide ($NiO_x$), aluminum oxide ($AlO_x$), zirconium oxide ($ZrO_x$), zinc oxide ($ZnO_x$), and copper oxide ($CuO_x$).

Figure 4L:
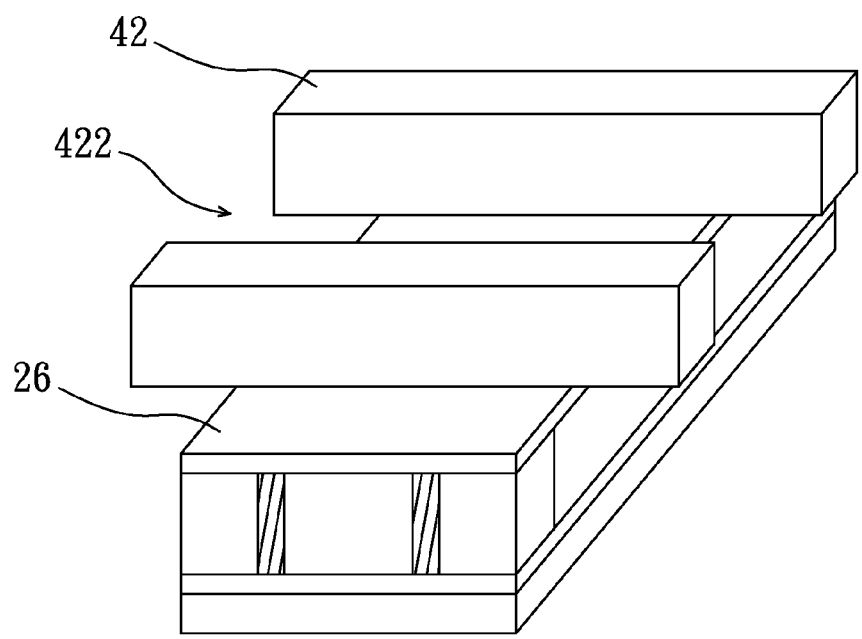
Figure 4M:
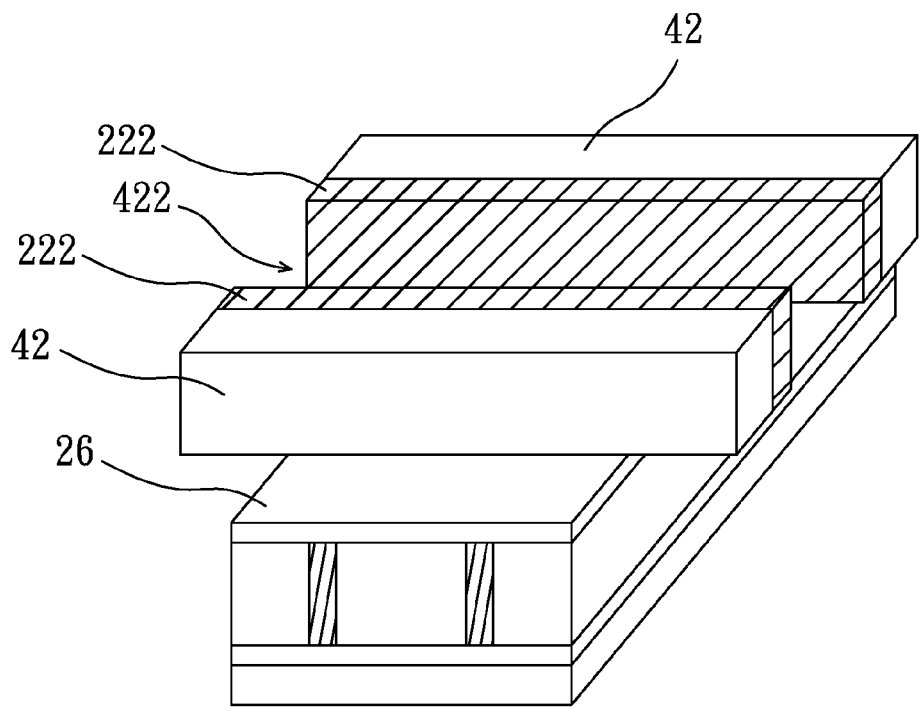
Figure 4N:
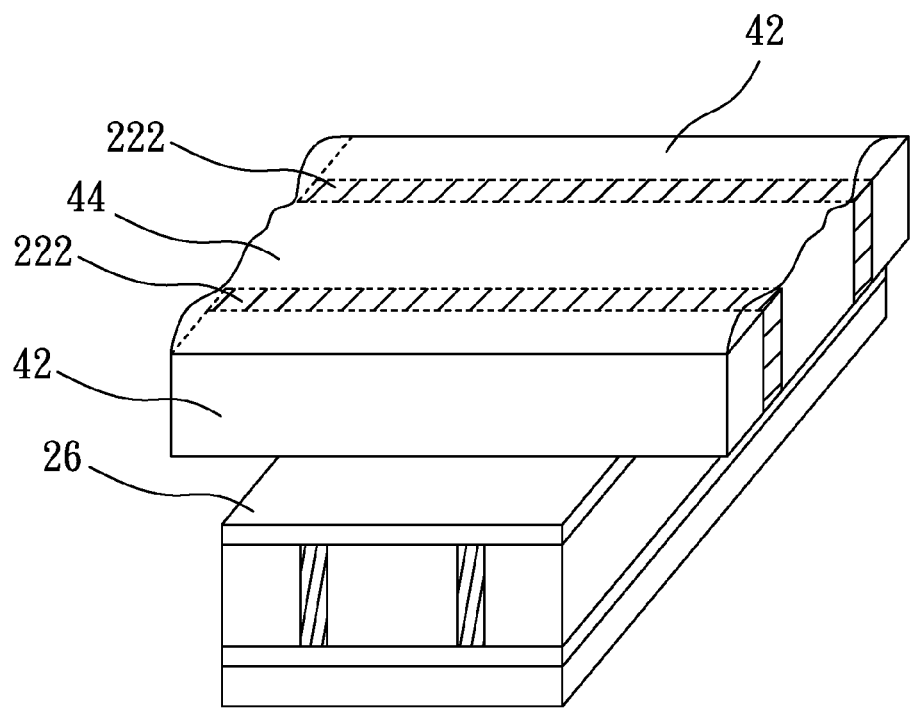
Figure 4O:
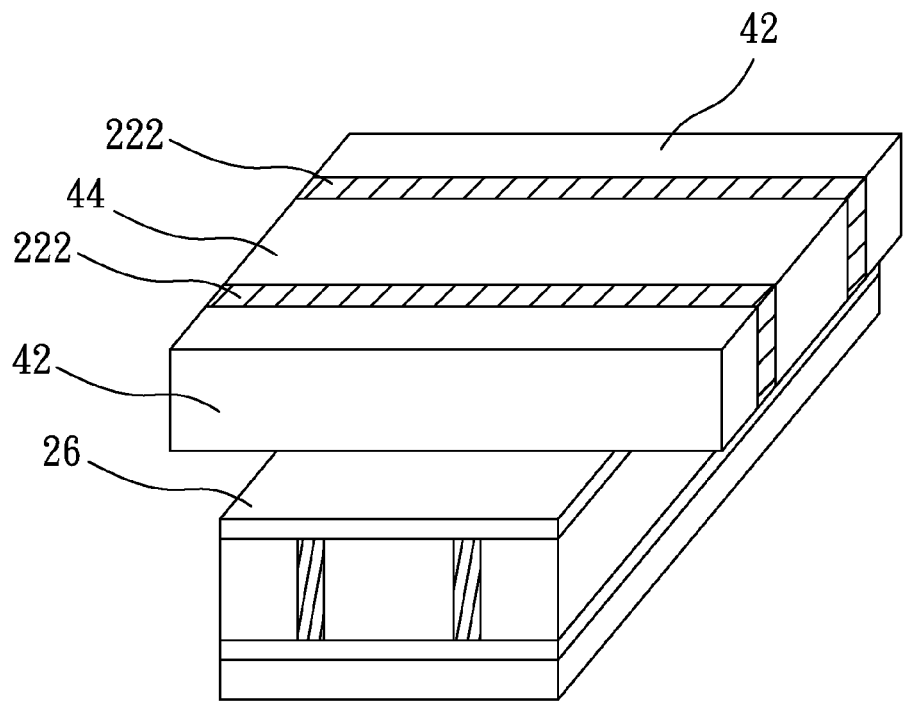
Figure 4P:
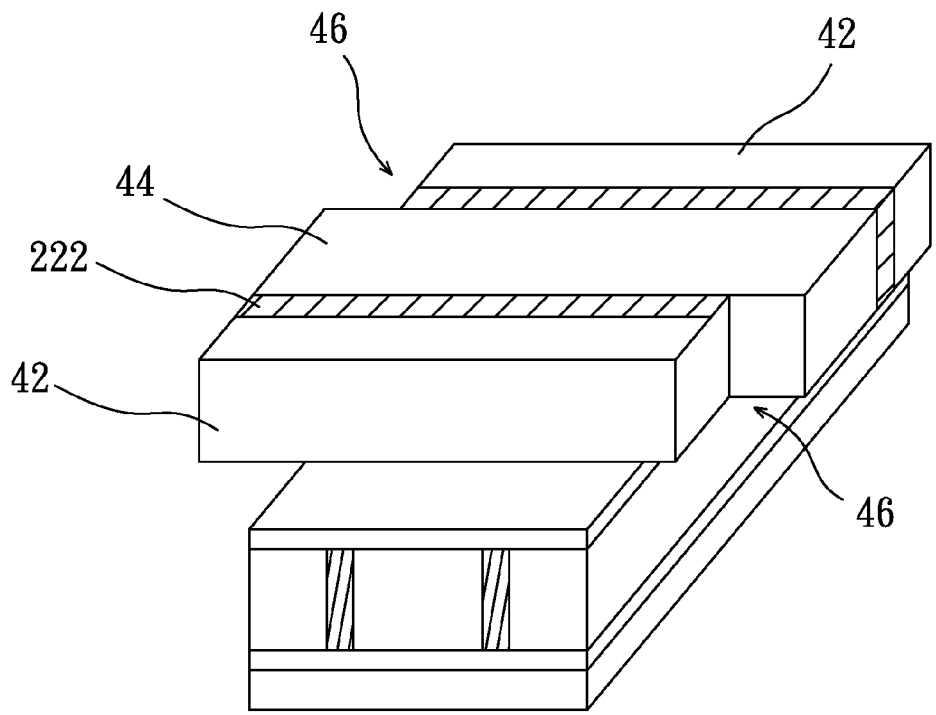

Next, an upper electrode 22 will be fabricated in the same way as the lower electrode 24. Note that the lower electrode 24 is arranged in the X-axis direction and the upper electrode 22 is arranged in the Y-axis direction. In other words, the upper electrode 22 intersects the lower electrode 24. In Step S26, form on the resistive layer 26 a complete layer of a first upper dielectric layer 42 (such a dielectric layer made of silicon nitride (SiN)), and use a photolithography-etching process to form a trench 422 in the middle of the first upper dielectric layer 42, whereby are generated two separate first upper dielectric layers 42 on the resistive layer 26, as shown in FIG. 4L. In Step S28, form a complete layer of an upper electrode 22 over the first upper dielectric layer 42 and the resistive layer 26 (including the resistive layer 26 inside the trench 422) with a CVD, PVD, or ALD method; use an RIE process together with chlorine, argon or hydrogen bromide to remove the upper electrode 22 on the first upper dielectric layer 22 and remove a portion of the upper electrode 22 inside the trench 422 to form two separate upper sub-electrodes 222 respectively on two sidewalls of the two separate first upper dielectric layers 42, as shown in FIG. 4M. The preferred width of the upper sub-electrode 222 is 1-10 nm. In Step S30, use a CVD method to form a second upper dielectric layer 44 over the resistive layer 26 inside the gap between the two upper sub-electrodes 222, as shown in FIG. 4N. The second upper dielectric layer 44 is made of silicon dioxide or silicon nitride. As shown in FIG. 4N, the as-deposited second upper dielectric layer 44 is rugged. Therefore, a CMP (Chemical Mechanical Polishing) method is used to flatten the as-deposited second upper dielectric layer 44 and make the top of the second upper dielectric layer 44 and the top of two upper sub-electrodes 222 on the same plane, as shown in FIG. 4O. In Step S32, use a photolithography-etching process to remove a portion of the two upper sub-electrodes 222 and a portion of the first upper dielectric layers 42 to form two second openings 46 respectively at two opposite ends of the second upper dielectric layers 44, as shown in FIG. 4P. Thereby, the two upper sub-electrodes 222 are disconnected electrically and can be controlled independently. The description of the abovementioned steps demonstrates that the present invention can fabricate two upper sub-electrodes 222 in a dimension of 1 F.

Figure 4Q:
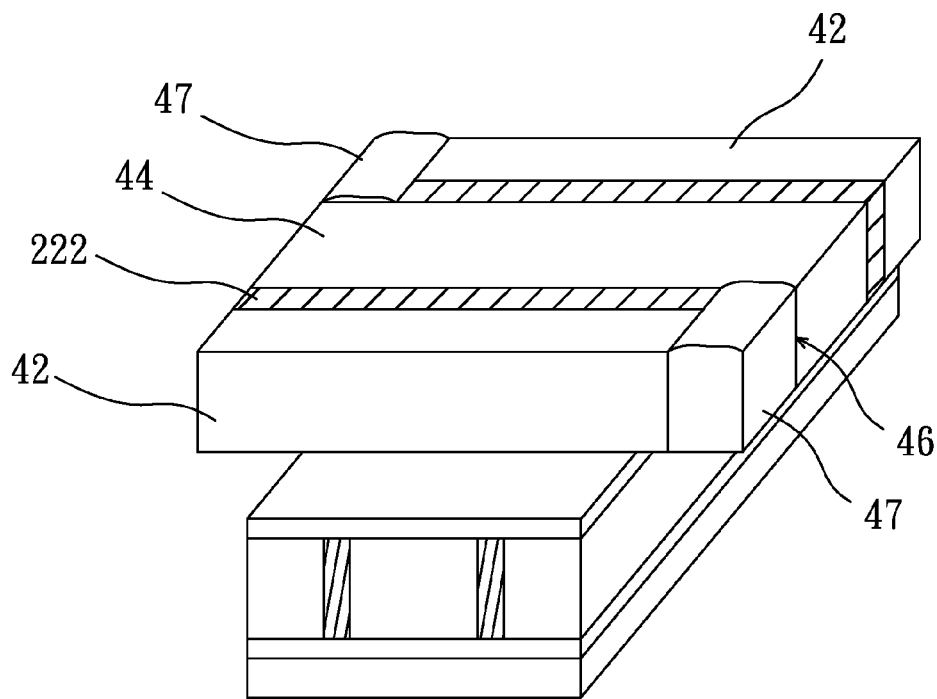

Via the abovementioned method, the original lower electrode 24 is fabricated into two lower sub-electrodes 242, and the original upper electrode 22 is fabricated into two upper sub-electrodes 222, whereby the capacity of a memory is quadrupled in an identical area. In Step S34, form two third upper dielectric layers 47 inside the two second openings 46, as shown in FIG. 4Q. The third upper dielectric layers 47 are made of nitride or oxide. Similarly, the third upper dielectric layers 47 are flattened with a CMP method, as shown in FIG. 4R. Step S12-Step S32 may be repeated to stack memory cells and increase memory capacity.

Figure 6:
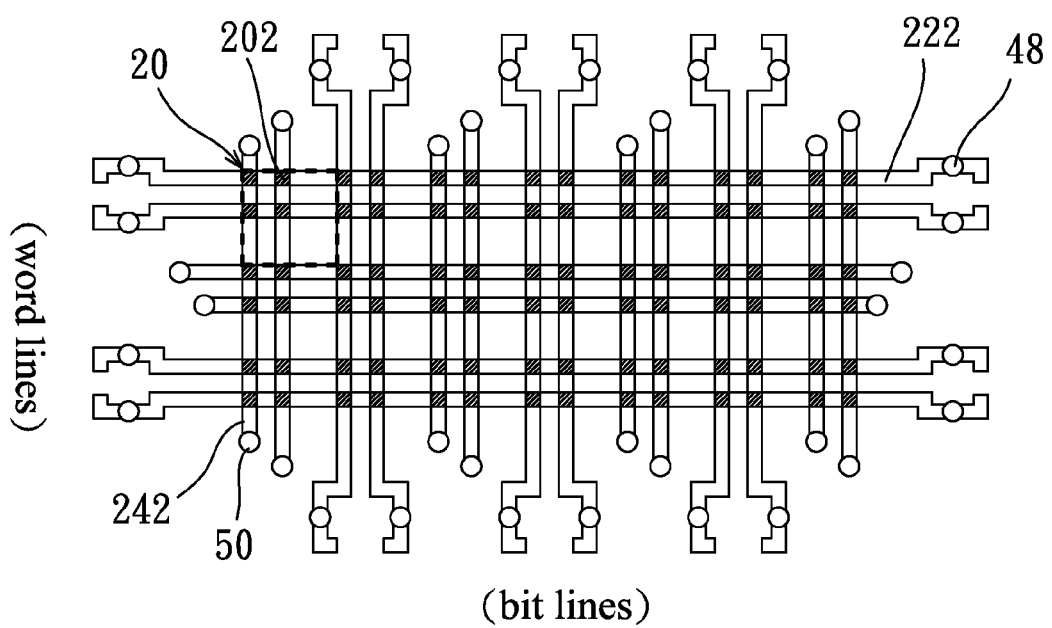
FIG. 6 schematically shows the external connections of the memory cells according to one embodiment of the present invention.

Refer to FIG. 3 and FIG. 6. FIG. 6 schematically shows the external connections of the memory cells. The two upper sub-electrodes 222 of each memory cell 20 function as word lines and respectively connect with upper electric contacts 48. Pairs of the upper electric contacts 48 are arranged intermittently. The two lower sub-electrodes 242 of each memory cell 20 function as bit lines and respectively connect with lower electric contacts 50. Pairs of the lower electric contacts 50 are arranged intermittently, too. Thus is effectively utilized the external connection area of the word lines and bit lines and achieved the optimal design of the sub-memory cells 202 and the ultra high density of the memory.

The embodiments described above are only to exemplify the present invention but not to limit the scope of the present invention. Any equivalent modification or variation according to the characteristics of spirit of the present invention is to be also included within the scope of the present invention.

Figure 7A:
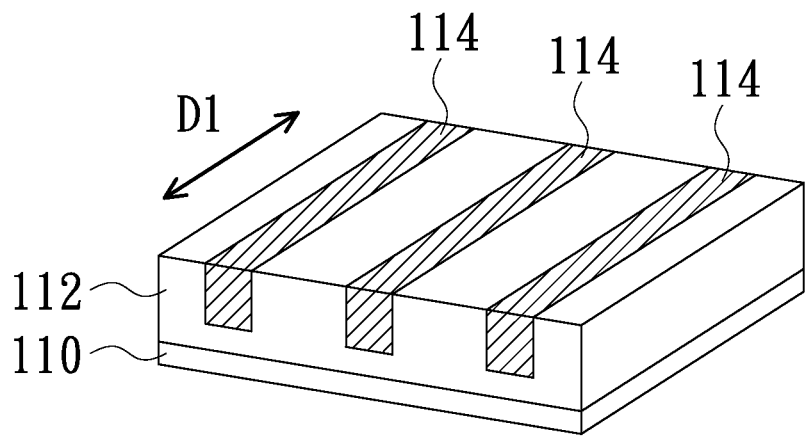
FIGS. 7A-7H are cross-sectional views of processing structures illustrating a method for fabricating a semiconductor memory storage array device in accordance with one embodiment of the present invention.

FIGS. 7A-7H are cross-sectional views of processing structures illustrating a method for fabricating a semiconductor memory storage array device in accordance with one embodiment of the present invention, wherein the method comprises several steps as follows: Referring to FIG. 7A, a substrate 110 comprising a zeroth insulator layer 112 and a plurality of zeroth signal lines 114 extending along a first direction D1 is firstly provided, wherein the zeroth insulator layer 112 is formed on the substrate 110; the signal lines 114 are formed in the zeroth insulator layer 112; and the signal lines 114 are separated from each other by the zeroth insulator layer 112. In the present embodiment, the signal lines 114 may function as word lines of the semiconductor memory storage array device.

Figure 7B:
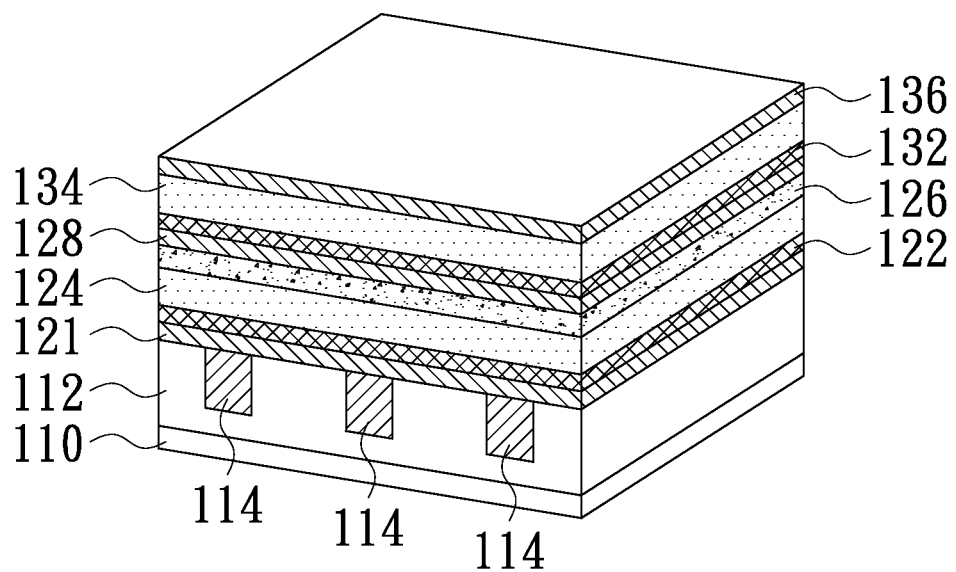

Referring to FIG. 7B, a buffer layer 121, a first electrode layer 122, an oxide layer 124, a sacrifice layer 126, a second electrode layer 128, a third electrode 132, a memory material layer 134 and a fourth electrode layer 136 are formed in a manner of sequentially stacked on the zeroth insulator layer 112 and the signal lines 114, wherein the sacrifice layer 126 may be formed either between the first electrode layer 122 and the oxide layer 124 or between the second electrode layer 128 and the oxide layer 124. In other words, the arrangement of the sacrifice layer 126 that is disposed between the oxide layer 124 and the second electrode layer 128, as depicted in the FIG. 7B, is just illustrative, but not used to limit the scope of the present invention. In some other embodiments, the sacrifice layer 126 may be disposed between the first electrode layer 122 and the oxide layer 124.

The buffer layer 121 is an optional interface layer used to prevent the first electrode layer 122 from being peeled off from the zeroth insulator layer 112 and the signal lines 114. A processor can determine whether or not to form the buffer layer 121 according to a binding force that is needed to fix the first electrode layer 122 on the zeroth insulator layer 112 as well as the signal lines 114 securely. In one preferred embodiment of the present invention, the first electrode layer 122 is made of tungsten (W), the buffer layer 121, meanwhile, may be made of, but not limited to, titanium nitride (TiN), titanium (Ti), tantaium (Ta) or tantaium nitride (TaN). The oxide layer 124 is made of materials selected from a group consisting of tungsten oxide ($WO_x$), hafnium oxide ($HfO_x$), titanium oxide ($TiO_x$), nitric oxide ($NiO_x$), aluminium oxide ($AlO_x$), zirconium oxide ($ZrO_x$), zinc oxide ($ZnO_x$) and copper oxide ($CuO_x$). The memory material layer 134 may be a phase change random access memory (PCRAM) layer, a magnetoresistive random access memory (MRAM) layer or a resistive random access memory (RRAM) layer, wherein the PCRAM layer is made of ($Ge_2Sb_2Te_5$); the MRAM layer comprises a Fe/MgOx/Fe multilayer structure; and the RRAM layer is made of material selected from a group consisting of $WO_x$, $HfO_x$, $TiO_x$, $NiO_x$, $AlO_x$, $ZrO_x$, $ZnO_x$ and $CuO_x$. For convenience purpose, thereinafter the material layer 134 may be presented as a RRAM layer. In other words the memory elements of the semiconductor memory array device may be presented as RRAM elements. However, the following embodiments are just illustrative but not used to limit the scope of the present invention. Other kinds of memory element may be also applied in the embodiments of the present invention.

The sacrifice layer 126 is made of silicon oxide ($SiO_x$) or silicon nitride (SiN), and the third electrode layer 132 is made of W. It is worthy to note that since the second electrode layer 128 that is disposed between the sacrifice layer 126 and the third electrode layer 132 is made of TiN, Ti, Ta or TaN, thus while the third electrode layer 132 is made of W, the second electrode layer 128 can function as a buffer layer used to prevent the third electrode layer 132 from being peeled off from the sacrifice layer 126 and to improve the process reliability. Similarly, the aforementioned materials used to form the sacrifice layer 126, the second electrode layer 128 and the third electrode layer 132 are just illustrative, and other suitable materials can be also applied.

Figure 7C:
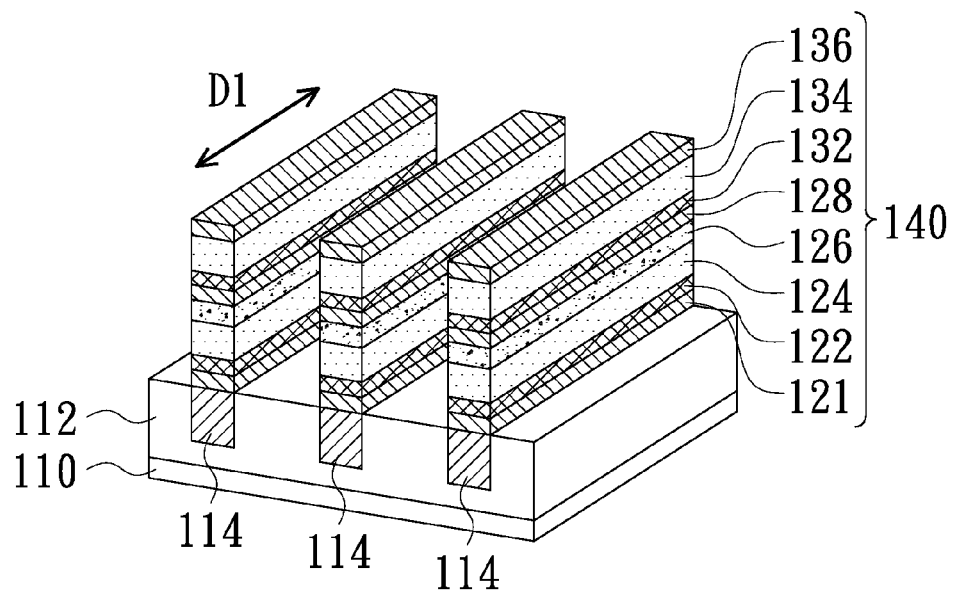

Referring to FIGS. 7B and 7C, an etching process is next performed to remove portions of the buffer layer 121, the first electrode layer 122, the oxide layer 124, the sacrifice layer 126, the second electrode layer 128, the third electrode layer 132, the memory material layer 134 and the fourth electrode 136 to define a plurality of zeroth structures 140, wherein each of the zeroth structures 140 is disposed over one of the zeroth signal lines 114 and extending along the first direction D1. In the present embodiment, each of the zeroth structures 140 shapes as a long column composed by strip portions of the remaining buffer layer 121, the remaining first electrode layer 122, the remaining oxide layer 124, the remaining sacrifice layer 126, the remaining second electrode layer 128, the remaining third electrode layer 132, the memory material layer 134 and the fourth electrode layer 136.

Figure 7D:
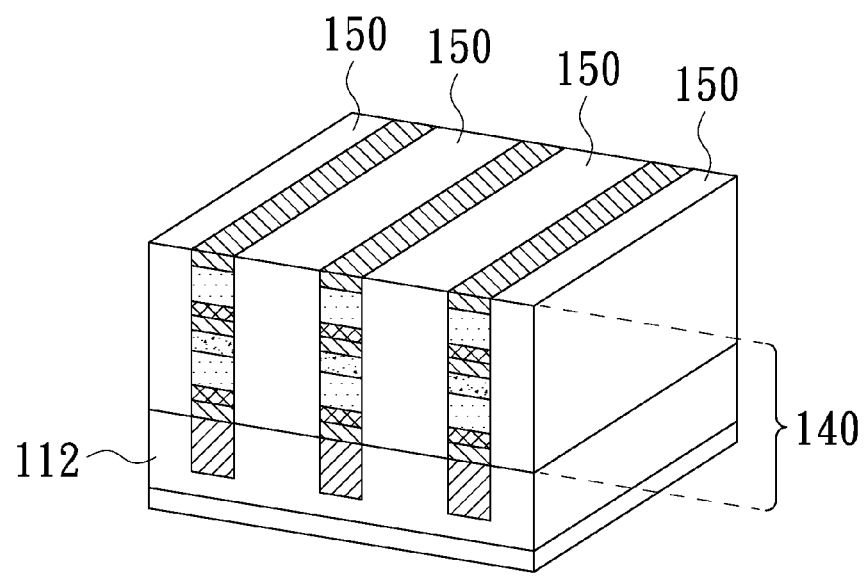
Figure 7E:
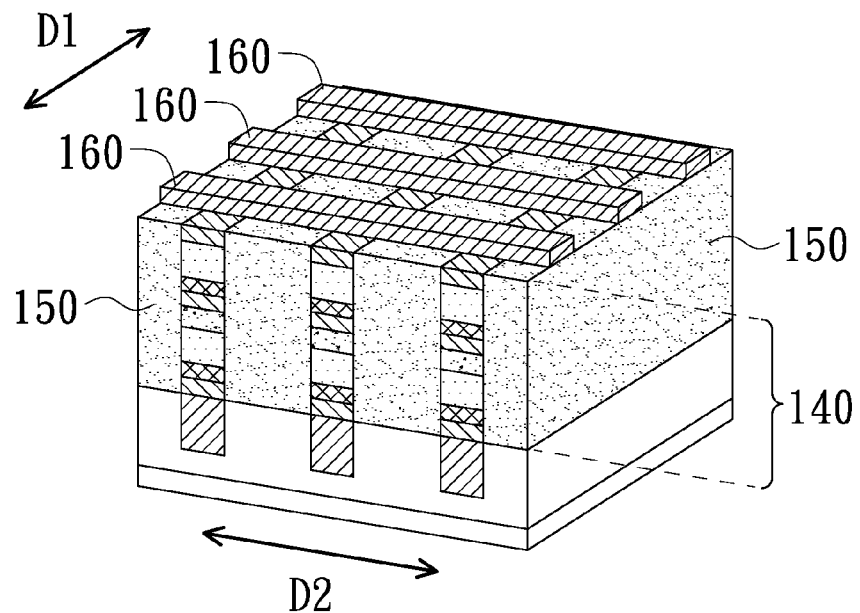

Referring to FIGS. 7D and 7E, after the zeroth structures 140 are defined, a first insulator layer 150 is then formed on the zeroth buffer layer 112 to fill the slit trenches defined by two adjacent zeroth structures 140 (see FIG. 7D). Subsequently, a plurality of second signal lines 160 extending along a second direction D2 are formed on the first insulator layer 150 and the zeroth structures 140, wherein the second direction D2 and the first direction D1 form a right angle (see FIG. 7E). However, in some other embodiment, the angle formed by the second direction D2 and the first direction D1 is not limited to 90°. In some embodiments of the present invention, the first insulator layer 150 and the zeroth buffer layer 112 may consist of identical material. The second signal lines 160 may function as the word lines of the semiconductor memory storage array device.

Figure 7F:
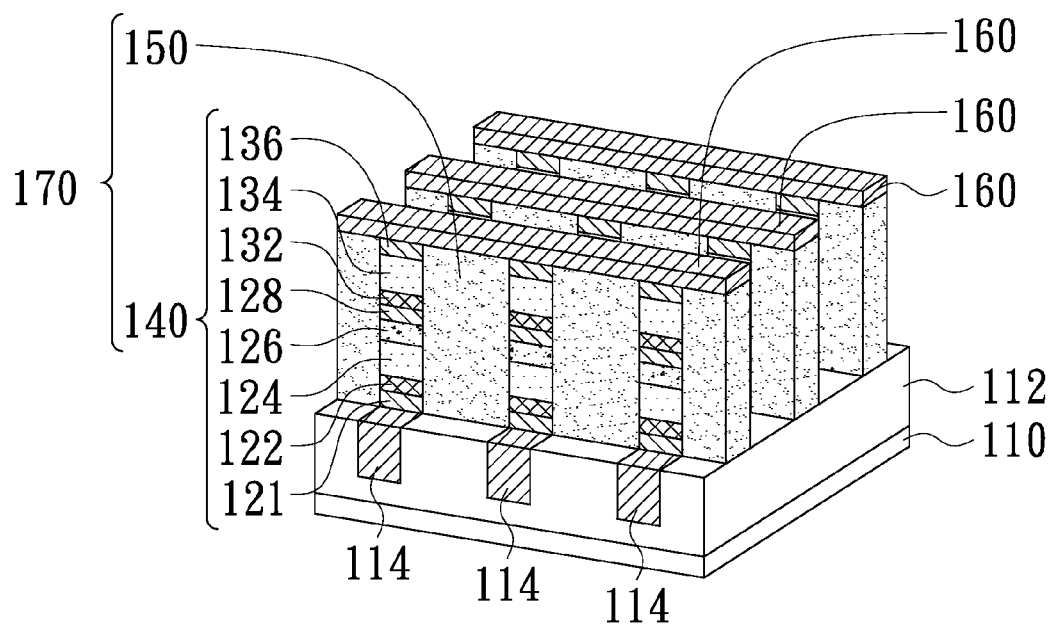
Figure 7G:
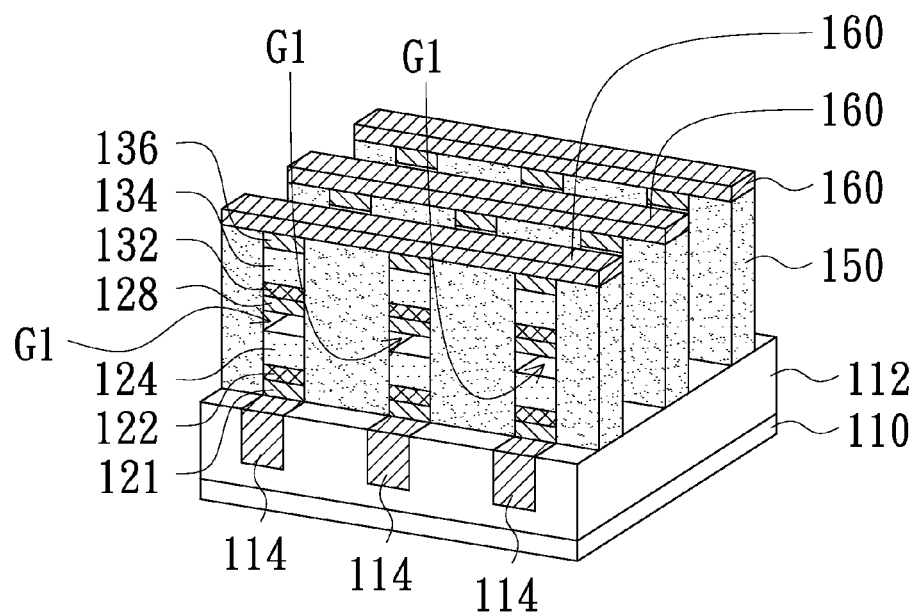
Figure 7H:
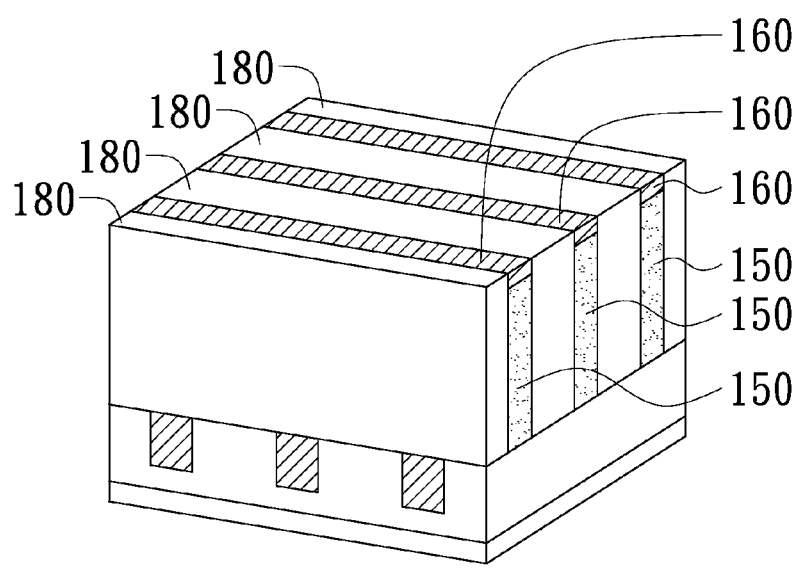

Referring to FIGS. 7F and 7G, another etching process using the second signal lines 160 as the mask is subsequently performed to remove portions of the first insulator layer 150 and the zeroth structures 140, so as to form a plurality of first structures 170 lying beneath the second signal lines 160. In the present embodiment, each of the first structures 170 shapes as a long column composed by portions of the reaming first insulator layer 150 and the reaming zeroth structures 140, wherein the reaming zeroth structures 140 may shape as pillars composed by portions of the remaining buffer layer 121, the remaining first electrode layer 122, the remaining oxide layer 124, the remaining sacrifice layer 126, the remaining second electrode layer 128, the remaining third electrode layer 132 and the remaining fourth electrode 134. Accordingly two ends of the sacrifice later 126 can be exposed from the trenches formed by the etching process and used to defined the long column of the structure 170 (see FIG. 7F). Yet another etching process is then performed to remove the reaming sacrifice layer 126, whereby a gap G1 defined by the remaining portions of the oxide layer 124, the second electrode layer 128 and the first insulator layer 150 can be formed in each of the pillars (see FIG. 7F). It is worthy to note that because the sacrifices layer 126 and the first insulator layer 150 are both dielectric layers, the material used to form the first insulator layer 150 is preferably different from the material consisting of the sacrifices layer 126 to prevent the first insulator layer 150 being removed by the etching process for forming the gap G1. In addition, the etching process necessitates a proper selectability to only remove the sacrifices layer 126 instead of damaging the first insulator layer 150. For example, on the one hand, when the sacrifices layer 126 is made of SiN, and the material consisting of the first insulator layer 150 can be $SiO_x$; a phosphoric acid based etching process may be applied to remove the sacrifices layer 126. On the other hand, when the sacrifices layer 126 is made of $SiO_x$, and the material consisting of the first insulator layer 150 is SiN; an etching process comprising hydrofluoric acid (HF) and buffer oxide etcher (BOE) may be applied to remove the sacrifices layer 126. In a preferred embodiment of the present invention, the sacrifices layer 126 has a thickness about 10 angstrom (Å), thus the gap G1 that is formed by removing the sacrifices layer 126 may have a height calculated from the oxide layer 124 to the second electrode layer 128 substantially equal to or less than 10 Å. Besides, if the sacrifices layer 126 is alternatively formed between the oxide layer 124 and the first electrode layer 122, the gap G1 should be defined by the first insulator layer 150, the oxide layer 124 and the first electrode layer 122.

Referring to FIG. 7G, the semiconductor memory storage array device formed by the aforementioned method comprises a substrate 110, a zeroth isolator layer 112, a plurality of zeroth signal lines 114, a buffer layer 121, a first electrode layer 122, an oxide layer 124, a Gap G1, a second electrode layer 128, a third electrode layer 132, a memory material layer 134, a fourth electrode layer 136, a plurality of first signal lines 160 and a first isolator layer 150. The zeroth isolator layer 112 is disposed on the substrate 110. The zeroth signal lines 114 are disposed in the zeroth isolator layer 112 extending along a first direction D1, and each of the zeroth signal lines 114 is separated by the zeroth isolator layer 112. The buffer layer 121, the first electrode layer 122, the oxide layer 124, the second electrode layer 128, the third electrode layer 132, the memory material layer 134 and the fourth electrode layer 136 are sequentially stacked on the zeroth signal lines 114 to form a plurality of pillar structures. The first isolator layer 150 is disposed on the zeroth isolator layer 112 and adjacent to two sidewalls of each pillar structures in a manner of staggering the pillar structures. The first signal lines 160 is disposed on the first isolator layer 150 and the plurality of pillar structures and extends along a second direction D2 to overlap the zeroth signal lines 114, wherein the pillar structures are disposed within the overlapped areas identified by the zeroth signal lines 114 and the first signal lines 160. The gap G1 is defined by the second electrode layer 128, the oxide layer 124 and the first isolator layer 150. However, in some other embodiments, the gap G1 may be defined by the first electrode layer 122, the oxide layer 124 and the first isolator layer 150. In other words, the gap G1 may be formed either between the second electrode layer 128 and the oxide layer 124 or between the first electrode layer 122 and the oxide layer 124.

Functionally, the first electrode layer 122, the oxide layer 124, the second electrode layer 128 and the gap G1 formed there among may compose a threshold vacuum switch (TVS), and the third electrode layer 132, the memory material layer 134 and the fourth electrode layer 136 may compose a RRAM element. Accordingly, in the embodiments of the present invention, the TVS connected to the RRAM element in series may function as a selector of the semiconductor memory storage array device. In some embodiments, a vacuum is created in the gap G1. However, in other embodiment, the gap G1 is alternatively filled with air. In other words, the state of the gap G1 is conditional upon the arrangements of the subsequent process for fabricating the semiconductor memory storage array device. For example, subsequent processes for forming one or more additional films on the first signal lines 160 may be continued after the processes for forming the structure depicted in FIG. 7G is carried out, a vacuum is created in the gap G1, because the vacuum constant in the gap G1 is always kept identical with the process environment. Typically, a second insulator layer 180 may be formed to fill the trenches used to defined the first signal lines 160 and the first structure 170 (see FIG. 7H) before the subsequent processes for forming the additional films are carried out. In order to prevent the gap G1 from being filled by the second insulator layer 180, the second insulator layer 180 is preferably formed by a high density plasma chemical vapor deposition (HDCVD) process or an E-Gun evaporating process. And a confined space may be defined by the second electrode layer 128, the oxide layer 124, the first insulator layer 150 and the second insulator layer 180, after the second insulator layer 180 is formed to block the two ends of the gap G1. In some embodiments of the present invention, the first insulator layer 150 and the second insulator layer 180 may be made of identical material.

In the embodiments of the present invention, the TVS composed by the first electrode layer 122, the oxide layer 124, the second electrode layer 128 and the gap G1 is connected to the RRAM element composed by the third electrode layer 132, the memory material layer 134 and the fourth electrode layer 136 in series. Typically, an RRAM element comprises a memory material layer (such as the memory material layer 134) made of metal oxide or transition metal oxide with a high resistance state, when a positive bias voltage is imposed onto the RRAM element the resistance state of the memory material layer may be changed from high to low; and the resistance state of the memory material layer may remain at low even if it is not constantly supplied with electric power, whereby the RRAM element can retain the programmed information permanently to implement so called "non-volatile storage". Alternatively, when a negative bias voltage is imposed onto the RRAM element, the resistance state of the memory material layer may return to high, so as to erase the programmed information. The physical structure and materials of the TVS are similar to that of the RRAM element except the existence of the gap G1. Theoretically, the operation mechanism of the TVS would similar to that of the RRAM element. However, if the gap G1 is taken into account, the low resistance state of the memory material layer (the oxide layer 124) may return to high, instead of remaining at low, while it is not constantly supplied with electric power. The non-volatile characteristic of the oxide layer 124 is no longer valid. Practically, the TVS electrically connected to the RRAM element in series functions as a selector of the RRAM element. When a positive bias voltage is imposed onto the TVS, the TVS could be turn on due to tunnel electrons passing though the gap G1; and turn off while it is not constantly supplied with electric power. However, it should be appreciated that the TVS is not limited to be connected with the RRAM to form a no-volatile memory device and serving as a selector thereof. In some embodiment, the TVS element may be connected to a PCRAM element or a MRAM element in series to form a no-volatile memory device and serving as a selector thereof.

It worthy to note that, in the preferred embodiment, the height of the gap G1 calculated from the electrode layer, either the first electrode layer 122 or the second electrode layer 128, to the oxide layer 124 should be limited equal to or less than 10 Å to allow tunnel electrons passing though, while the electrode layer consists of TiN, and the material of the electrode layer (either the first electrode layer 122 or the second electrode layer 128) that is associated with the oxide layer 124 and the insulator layer 150 to form the gap G1 is made of TiN.

Figure 8:
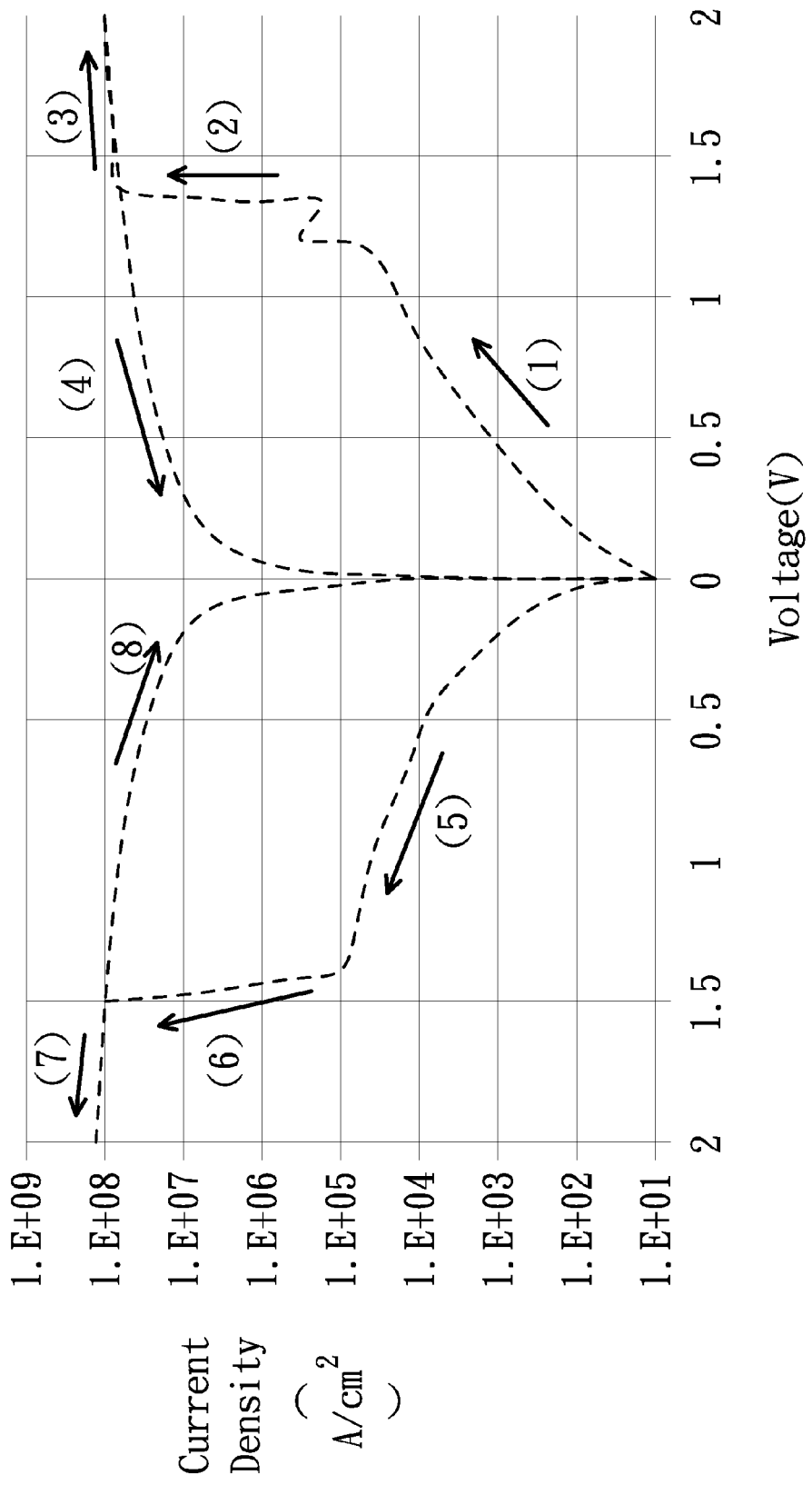
FIG. 8 is a diagram illustrating switching characteristics of a TVS selector in accordance with one embodiment of the present invention.

FIG. 8 is a diagram illustrating switching characteristics of the TVS selector, wherein the X axle indicates the voltage and the Y axle indicates the current density; the numbered arrows 1-3, 4, 5-7 and 8 represent the current density under the conditions while the TVS selector is subjected to a positive bias voltage, no positive bias voltage is constantly supplied, the TVS selector is subjected to a negative bias voltage and no negative bias voltage is constantly supplied respectively. According to FIG. 8, when the bias voltage (for example, about ±1 volt) imposed on the TVS selector is less than the threshold voltage of the TVS, on the one hand, the current density is measured bout $10^4$ A/cm$^2$. On the other hand, when the bias voltage (for example, about ±2 volt) imposed on the TVS selector is grater than the threshold voltage of the TVS, the current density is measured bout $10^8$ A/cm$^2$. In comparison with the conventional selectors, the TVS selector of the present invention provides greater current density to the RRAM element. It is suggested that the leaking current and the sneak current problems may be improved by the TVS selector of the present invention.

Figure 9A:
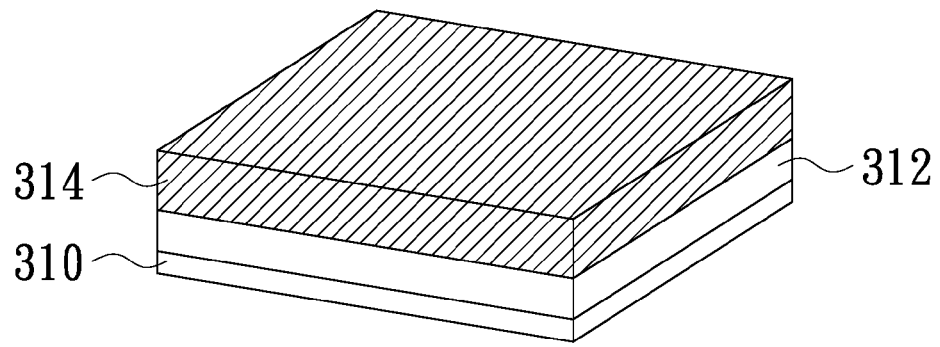
FIGS. 9A-9D are cross-sectional views illustrating portions of processing structures for fabricating a semiconductor memory storage array device in accordance with another embodiment of the present invention.
Figure 9B:
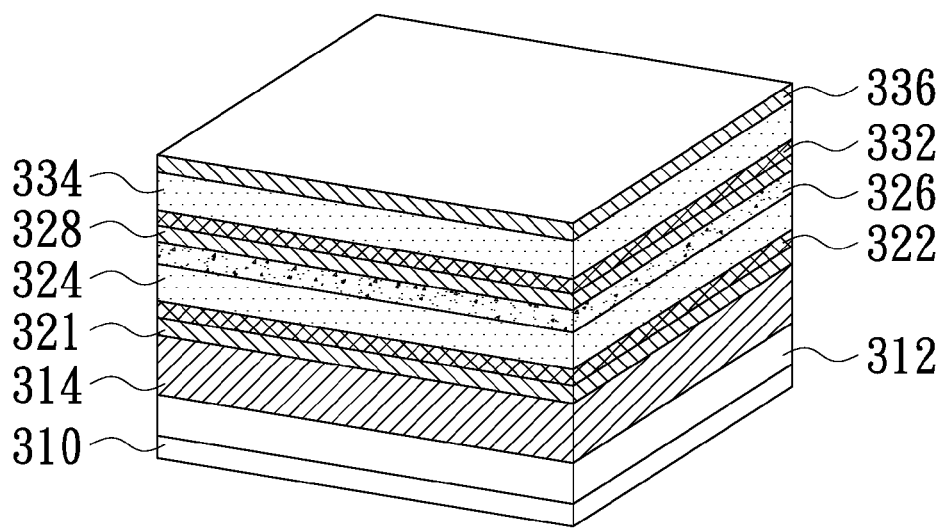

FIGS. 9A-9D are cross-sectional views illustrating portions of the processing structures for fabricating a semiconductor memory storage array device in accordance with another embodiment of the present invention, wherein the method comprises several steps as follows: Referring to FIG. 9A, a substrate 310 is firstly provided, and a zeroth insulator layer 312 and a zeroth signal layer 314 are sequentially formed on the substrate 310. Next, a buffer layer 321, a first electrode layer 322, an oxide layer 324, a sacrifice layer 326, a second electrode layer 328, a third electrode 332, a memory material layer 334 and a fourth electrode layer 336 are formed and sequentially stacked on the zeroth signal layer 314 (as shown in FIG. 9B). Since the arrangements of the sacrifice layer 326 and the materials for forming the buffer layer 321, the first electrode layer 322, the oxide layer 324, the sacrifice layer 326, the second electrode layer 328, the third electrode 332, the memory material layer 334 and the fourth electrode layer 336 are similar to that of the aforementioned embodiments, thus the detailed steps and materials for fabricating the same are not redundantly described.

Figure 9C:
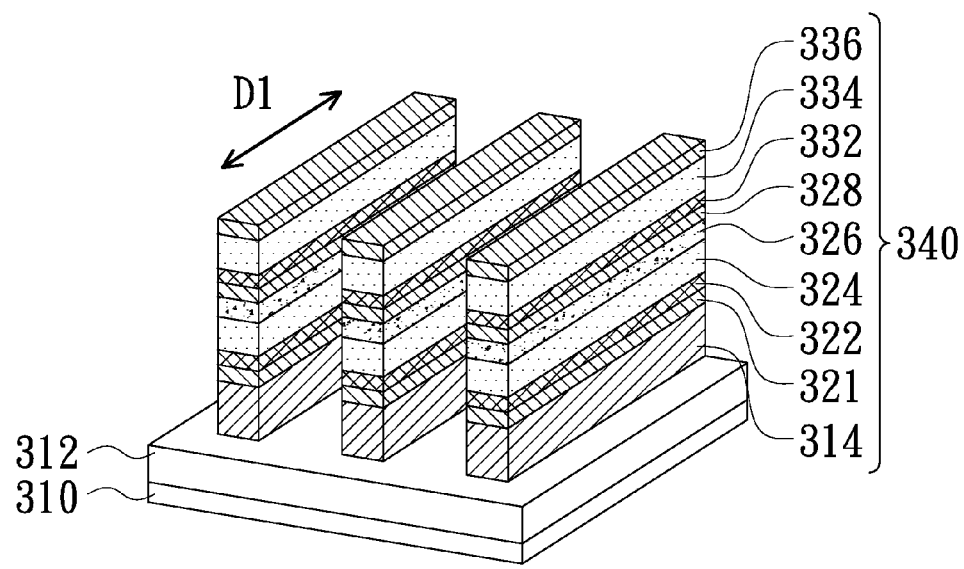
Figure 9D:
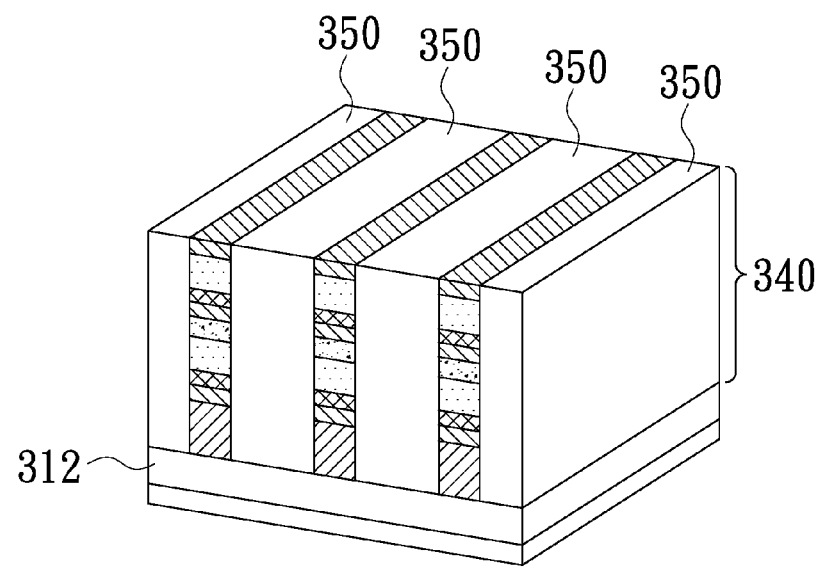

Referring to FIGS. 9C and 9D, an etching process is then performed to remove portions of the zeroth signal layer 314, the buffer layer 321, the first electrode layer 322, the oxide layer 324, the sacrifice layer 326, the second electrode layer 328, the third electrode layer 332, the memory material layer 334 and the fourth electrode 336 to define a plurality of zeroth structures 340, wherein each of the zeroth structures 340 is disposed over the zeroth insulator layer 312 and extending along the first direction D1 (as shown in FIG. 9D). In the present embodiment, each of the zeroth structures 340 shapes as a long column composed by strip portions of the remaining zeroth signal layer 314, the remaining buffer layer 321, the remaining first electrode layer 322, the remaining oxide layer 324, the remaining sacrifice layer 326, the remaining second electrode layer 328, the remaining third electrode layer 332, the remaining memory material layer 334 and the remaining fourth electrode 336, wherein the remaining portions of the zeroth signal layer 314 may function as word lines of the semiconductor memory storage array device. After the zeroth structures 340 are defined, a first insulator layer 350 is then formed on the zeroth buffer layer 312 to fill the slit trenches defined by two adjacent zeroth structures 340 (see FIG. 9D). Since the subsequent processes for fabricating the semiconductor memory storage array device are identical to that depicted in the FIGS. 7E to 7H, thus they are not redundantly described.

It is worthy to note that since the word lines (the remaining zeroth signal layer 314) and the zeroth structures 340 composed by strip portions of the remaining buffer layer 321, the remaining first electrode layer 322, the remaining oxide layer 324, the remaining sacrifice layer 326, the remaining second electrode layer 328, the remaining third electrode layer 332, the remaining memory material layer 334 and the remaining fourth electrode 336 are formed by the same etching process, thus the separate lithographic step for forming the word lines can be saved, and the zeroth structures 340 can align the word lines more accurately, in comparison with the processes depicted in FIGS. 7A to 7D. In other words, the yield of the processes depicted in FIGS. 9A to 9D can be greater than that depicted in FIGS. 7A to 7D.

In accordance with the aforementioned embodiments of the present invention, a multilayer structure comprising a first electrode layer, an oxide layer and a second electrode layer stacked in sequence as well as a gap defined either between the first electrode layer and the oxide layer or between the second electrode layer and the oxide layer is provided serving as a threshold voltage vacuum switch connected with a memory element of a RRAM device in series to provide the memory element a current density grater than $10^8$ A/cm² that is significantly grater than that provided by a convention selector applied by the RRAM, thereby problems of current leakage resulted form the critical feature size shrinkage of the RRAM device can be avoided. In addition, since the material consisting of the threshold voltage vacuum switch is compatible with the remaining process for forming the semiconductor memory storage array device, thus contaminations resulted form the process for fabricating the threshold voltage vacuum switch can be avoided and the yield of the semiconductor memory storage array device can be increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor memory storage array device formed on a substrate comprising:
   a memory cell, comprising:
      a first electrode layer;
      an oxide layer above the first electrode layer;
      a gap directly above the oxide layer;
      a second electrode layer directly above the gap and a memory material layer, disposed on the second electrode layer;
      a first insulator layer, disposed adjacent to a first sidewall of the memory cell; and
      second insulator layer, disposed adjacent to a second sidewall of the memory cell;
      wherein the gap is defined by the second electrode layer, the oxide layer, the first insulator layer and the second insulator layer.

2. The semiconductor memory storage array device according to claim 1, wherein the gap has a height about 10 angstrom (Å).

3. The semiconductor memory storage array device according to claim 1, wherein the oxide layer is made of metal oxide or transition metal oxide.

4. The semiconductor memory storage array device according to claim 1, wherein the memory material layer is a PCRAM layer, aMRAM layer or a RRAM layer.

5. The semiconductor memory storage array device according to claim 1, wherein the semiconductor memory storage array device comprising a threshold voltage vacuum switch is used for providing a current density greater than 108 Å/cm².

6. The semiconductor memory storage array device according to claim 1, further comprising a buffer layer, disposed between the substrate and the first electrode layer.

7. The semiconductor memory storage array device according to claim 6, further comprising;
   a signal line, disposed between the buffer layer and the substrate; and
   the first insulator layer and the second insulator layer disposed between the substrate and the signal line.

* * * * *